(12) United States Patent
Zenou et al.

(10) Patent No.: US 10,471,538 B2
(45) Date of Patent: Nov. 12, 2019

(54) CONTROL OF LIFT EJECTION ANGLE

(71) Applicant: Orbotech Ltd., Yavne (IL)

(72) Inventors: Michael Zenou, Hashmonaim (IL); Zvi Kotler, Tel Aviv (IL)

(73) Assignee: ORBOTECH LTD., Yavne (IL)

( * ) Notice: Subject to any disclaimer, the term of this patent is extended or adjusted under 35 U.S.C. 154(b) by 0 days.

(21) Appl. No.: 15/738,134

(22) PCT Filed: Jun. 7, 2016

(86) PCT No.: PCT/IL2016/050585
§ 371 (c)(1),
(2) Date: Dec. 20, 2017

(87) PCT Pub. No.: WO2017/006306
PCT Pub. Date: Jan. 12, 2017

(65) Prior Publication Data
US 2018/0193948 A1    Jul. 12, 2018

Related U.S. Application Data

(60) Provisional application No. 62/190,276, filed on Jul. 9, 2015.

(51) Int. Cl.
*B23K 26/064* (2014.01)
*B23K 26/067* (2006.01)
(Continued)

(52) U.S. Cl.
CPC ........ *B23K 26/064* (2015.10); *B23K 26/0604* (2013.01); *B23K 26/067* (2013.01);
(Continued)

(58) Field of Classification Search
CPC .. B23K 26/0622; B23K 26/342; B23K 26/57; B23K 26/0604; B23K 26/067; B23K 26/34; C23C 14/225; C23C 14/28
(Continued)

(56) References Cited

U.S. PATENT DOCUMENTS 1,393,637 A    10/1921  Ohashi
3,787,210 A *   1/1974  Roberts ................. B23K 26/18
                                              430/256

(Continued)

FOREIGN PATENT DOCUMENTS

CN    102566193 A    7/2012
EP      1847632 A1  10/2007
(Continued)

OTHER PUBLICATIONS

International Application # PCT/IL2016/050585 Search report dated Sep. 19, 2016.
(Continued)

*Primary Examiner* — Jimmy Chou
(74) *Attorney, Agent, or Firm* — Kligler & Associates (57) ABSTRACT

An apparatus for material deposition on an acceptor surface includes a transparent donor substrate having opposing first and second surfaces, and a donor film on the second surface. The apparatus additionally includes an optical assembly, which is configured to direct a beam of radiation to pass through the first surface of the donor substrate and impinge on the donor film at a location on the second surface so as to induce ejection of droplets of molten material from the donor film at an angle that is not normal to the second surface at the location onto the acceptor surface.

34 Claims, 7 Drawing Sheets

(51) Int. Cl.
| | |
|---|---|
| C23C 14/22 | (2006.01) |
| C23C 14/28 | (2006.01) |
| B23K 26/34 | (2014.01) |
| B23K 26/342 | (2014.01) |
| B23K 26/0622 | (2014.01) |
| B23K 26/57 | (2014.01) |
| B23K 26/06 | (2014.01) |
| G03F 7/16 | (2006.01) |
| B23K 101/42 | (2006.01) |

(52) U.S. Cl.
CPC .......... *B23K 26/0622* (2015.10); *B23K 26/34* (2013.01); *B23K 26/342* (2015.10); *B23K 26/57* (2015.10); *C23C 14/225* (2013.01); *C23C 14/28* (2013.01); *G03F 7/16* (2013.01); *B23K 2101/42* (2018.08)

(58) Field of Classification Search
USPC .............. 219/161.68, 121.69, 121.73, 121.8; 438/22, 597, 612; 524/548, 555, 556, 524/591, 571; 437/173, 245; 428/323; 427/596, 597; 361/760; 136/256
See application file for complete search history.

(56) References Cited

U.S. PATENT DOCUMENTS

| | | | |
|---|---|---|---|
| 3,935,566 A | 1/1976 | Snopko | |
| 3,963,852 A | 6/1976 | Baxter | |
| 3,964,389 A * | 6/1976 | Peterson | B41C 1/1091 430/302 |
| 4,608,328 A | 8/1986 | Schwartz et al. | |
| 4,714,628 A * | 12/1987 | Eloy | C23C 14/48 118/620 |
| 4,752,455 A * | 6/1988 | Mayer | B23K 20/08 219/121.6 |
| 4,891,183 A | 1/1990 | Corwin | |
| 4,895,735 A * | 1/1990 | Cook | C23C 14/048 156/234 |
| 4,931,323 A * | 6/1990 | Manitt | H01L 21/4867 427/555 |
| 4,970,196 A * | 11/1990 | Kim | C04B 41/4529 257/E21.347 |
| 4,987,006 A * | 1/1991 | Williams | B41M 5/24 427/123 |
| 5,090,828 A | 2/1992 | Shimura et al. | |
| 5,137,382 A | 8/1992 | Miyajima | |
| 5,138,482 A | 8/1992 | Hatori et al. | |
| 5,173,441 A * | 12/1992 | Yu | C23C 14/048 219/121.68 |
| 5,204,696 A | 4/1993 | Schmidlin et al. | |
| 5,292,559 A * | 3/1994 | Joyce, Jr. | C23C 26/00 156/272.8 |
| 5,322,986 A * | 6/1994 | Nutt | G02B 6/13 219/121.6 |
| 5,492,861 A * | 2/1996 | Opower | C23C 14/048 148/DIG. 93 |
| 5,683,601 A * | 11/1997 | Tatah | C23C 14/048 174/250 |
| 5,692,844 A | 12/1997 | Harrison et al. | |
| 5,885,929 A | 3/1999 | Brock et al. | |
| 5,935,462 A * | 8/1999 | Tatah | C23C 14/04 219/121.6 |
| 5,935,758 A | 8/1999 | Patel et al. | |
| 5,963,569 A | 10/1999 | Baumgart et al. | |
| 6,014,245 A | 1/2000 | Xu et al. | |
| 6,025,110 A | 2/2000 | Nowak | |
| 6,155,330 A | 12/2000 | Kinane et al. | |
| 6,159,832 A * | 12/2000 | Mayer | C23C 14/048 257/E21.169 |
| 6,177,151 B1 * | 1/2001 | Chrisey | C23C 14/048 219/121.85 |
| 6,261,493 B1 | 1/2001 | Gaylo et al. | |
| 6,412,143 B1 | 7/2002 | Chen | |
| 6,440,503 B1 | 8/2002 | Merdan et al. | |
| 6,583,381 B1 | 6/2003 | Duignan | |
| 6,649,861 B2 * | 11/2003 | Duignan | B23K 15/0006 219/121.6 |
| 6,766,764 B1 * | 7/2004 | Chrisey | C23C 14/048 118/726 |
| 6,792,326 B1 | 9/2004 | Duignan et al. | |
| 6,805,918 B2 * | 10/2004 | Auyeung | H05K 3/046 427/554 |
| 6,815,015 B2 * | 11/2004 | Young | H05K 3/046 427/554 |
| 6,822,189 B2 | 11/2004 | Hong et al. | |
| 6,896,429 B2 | 5/2005 | White et al. | |
| 6,899,988 B2 | 5/2005 | Kidnie et al. | |
| 6,905,738 B2 * | 6/2005 | Ringeisen | B01J 19/0046 427/554 |
| 6,936,311 B2 * | 8/2005 | Ringeisen | B01J 19/0046 427/554 |
| 7,014,885 B1 * | 3/2006 | Pique | C23C 14/048 427/294 |
| 7,019,891 B2 | 3/2006 | Johnson | |
| 7,116,907 B1 | 10/2006 | Nakazawa et al. | |
| 7,198,879 B1 * | 4/2007 | Tredwell | B41M 5/38207 430/200 |
| 7,236,334 B2 | 6/2007 | Ding et al. | |
| 7,277,770 B2 | 10/2007 | Huang et al. | |
| 7,294,367 B2 * | 11/2007 | Barron | A61B 18/20 427/595 |
| 7,358,169 B2 | 4/2008 | Zhu et al. | |
| 7,364,996 B2 | 4/2008 | Kawase et al. | |
| 7,375,819 B2 | 5/2008 | Courville et al. | |
| 7,423,286 B2 | 9/2008 | Handy et al. | |
| 7,534,543 B2 | 5/2009 | Kreilich et al. | |
| 7,534,544 B2 | 5/2009 | Principe et al. | |
| 7,538,929 B2 | 5/2009 | Wasilousky | |
| 7,608,308 B2 | 10/2009 | Liu et al. | |
| 7,633,035 B2 * | 12/2009 | Kirmeier | B23K 26/009 219/121.69 |
| 7,667,888 B2 | 2/2010 | Wasilousky | |
| 7,784,173 B2 | 8/2010 | Wolkin et al. | |
| 7,799,699 B2 | 9/2010 | Nuzzo et al. | |
| 7,938,855 B2 | 5/2011 | Gregorich et al. | |
| 7,942,987 B2 | 5/2011 | Crump et al. | |
| 7,982,296 B2 | 9/2011 | Nuzzo et al. | |
| 8,025,542 B2 | 9/2011 | Birrell et al. | |
| 8,056,222 B2 | 11/2011 | Pique et al. | |
| 8,101,247 B2 * | 1/2012 | Ringeisen | B23K 26/009 427/596 |
| 8,215,371 B2 | 7/2012 | Batchelder et al. | |
| 8,216,931 B2 | 7/2012 | Zhang et al. | |
| 8,221,822 B2 | 7/2012 | Flanagan et al. | |
| 8,262,916 B1 | 9/2012 | Smalley et al. | |
| 8,395,083 B2 * | 3/2013 | Naveh | B23K 26/0676 219/121.68 |
| 8,420,978 B2 * | 4/2013 | Jain | H01L 21/0272 219/121.69 |
| 8,440,546 B2 | 5/2013 | Nuzzo et al. | |
| 8,535,041 B2 | 9/2013 | Slafer | |
| 8,545,931 B2 | 10/2013 | Szuch | |
| 8,563,431 B2 * | 10/2013 | Miyairi | H01L 21/311 438/671 |
| 8,574,615 B2 | 11/2013 | Tenney et al. | |
| 8,729,524 B2 | 5/2014 | Rogers et al. | |
| 8,741,194 B1 | 6/2014 | Ederer et al. | |
| 8,743,165 B2 | 6/2014 | Sandstriim | |
| 9,027,378 B2 | 5/2015 | Crump et al. | |
| 9,029,058 B2 | 5/2015 | Martin | |
| 9,044,805 B2 | 6/2015 | Prest et al. | |
| 9,446,618 B2 | 9/2016 | Batt et al. | |
| 9,859,247 B2 * | 1/2018 | Smits | C09J 5/06 |
| 10,018,889 B2 | 7/2018 | Rozsa et al. | |
| 10,144,034 B2 * | 12/2018 | Zenou | G02B 6/3598 |
| 10,193,004 B2 * | 1/2019 | Zenou | H01L 21/4846 |
| 2002/0071901 A1 * | 6/2002 | Ringeisen | B01J 19/0046 427/2.1 |
| 2002/0085085 A1 | 7/2002 | Fischer et al. | |

(56) References Cited

U.S. PATENT DOCUMENTS

| | | | |
|---|---|---|---|
| 2002/0122898 A1* | 9/2002 | Ringeisen | B01J 19/0046 427/597 |
| 2002/0141039 A1 | 10/2002 | Mermelstein et al. | |
| 2002/0197401 A1* | 12/2002 | Auyeung | C23C 14/048 427/248.1 |
| 2003/0006534 A1 | 1/2003 | Taboas et al. | |
| 2003/0017277 A1* | 1/2003 | Young | C23C 14/048 427/596 |
| 2004/0029039 A1* | 2/2004 | Tutt | B41M 5/265 430/270.11 |
| 2004/0069471 A1 | 4/2004 | Corduan et al. | |
| 2004/0233408 A1 | 11/2004 | Sievers | |
| 2005/0056626 A1 | 3/2005 | Gross et al. | |
| 2005/0095367 A1 | 5/2005 | Babiarz et al. | |
| 2005/0112015 A1 | 5/2005 | Bampton | |
| 2005/0211163 A1 | 9/2005 | Li et al. | |
| 2005/0212888 A1* | 9/2005 | Lehmann | B41J 2/0057 347/171 |
| 2006/0188697 A1* | 8/2006 | Lee | H01L 51/0013 428/156 |
| 2006/0213886 A1* | 9/2006 | Sanders | B41M 5/38207 219/121.85 |
| 2007/0075063 A1* | 4/2007 | Wilbanks | B23K 26/03 219/121.85 |
| 2007/0203584 A1 | 8/2007 | Bdyopadhyay et al. | |
| 2008/0006966 A1 | 1/2008 | Mannella | |
| 2008/0041725 A1 | 2/2008 | Klein et al. | |
| 2008/0233291 A1 | 9/2008 | Chandrasekaran | |
| 2008/0286488 A1 | 11/2008 | Li et al. | |
| 2008/0314881 A1* | 12/2008 | Ringeisen | B23K 26/009 219/121.68 |
| 2008/0317893 A1 | 12/2008 | Gruber | |
| 2009/0074987 A1* | 3/2009 | Auyeung | H05K 3/046 427/596 |
| 2009/0130427 A1* | 5/2009 | Grigoropoulos | B41M 5/42 428/323 |
| 2009/0217517 A1 | 9/2009 | Pique et al. | |
| 2009/0284826 A1 | 11/2009 | Langdon | |
| 2010/0022078 A1 | 1/2010 | Rockenberger et al. | |
| 2010/0100635 A1 | 9/2010 | Gold et al. | |
| 2010/0264123 A1* | 10/2010 | Jennings | B23K 26/03 219/121.76 |
| 2010/0278521 A1 | 11/2010 | Sandler et al. | |
| 2011/0037953 A1* | 2/2011 | Nizani | G02B 3/005 353/38 |
| 2011/0089412 A1* | 4/2011 | Fujimori | B41M 5/38214 257/40 |
| 2011/0097550 A1 | 4/2011 | Matusovsky et al. | |
| 2011/0136162 A1 | 6/2011 | Sun et al. | |
| 2011/0188016 A1 | 8/2011 | De Jager et al. | |
| 2011/0210103 A1* | 9/2011 | Bruland | B23K 26/082 219/121.67 |
| 2011/0304900 A1 | 12/2011 | Widzgowski et al. | |
| 2012/0025182 A1* | 2/2012 | Umeda | B41M 5/38214 257/40 |
| 2012/0080088 A1* | 4/2012 | Grabitz | H01L 31/02242 136/256 |
| 2012/0247740 A1 | 10/2012 | Gertner et al. | |
| 2013/0029480 A1* | 1/2013 | Niklaus | B81C 1/00373 438/482 |
| 2013/0176699 A1* | 7/2013 | Tonchev | C23C 14/06 361/760 |
| 2013/0302154 A1 | 11/2013 | Finlayson | |
| 2013/0313756 A1 | 11/2013 | Chen et al. | |
| 2013/0335504 A1* | 12/2013 | Sandstrom | G03F 7/2002 347/246 |
| 2014/0071421 A1 | 3/2014 | De Jager et al. | |
| 2014/0097277 A1 | 4/2014 | Kumta et al. | |
| 2014/0160452 A1* | 6/2014 | De Jager | G03F 7/70375 355/53 |
| 2014/0231266 A1 | 8/2014 | Sherrer et al. | |
| 2014/0238574 A1 | 8/2014 | Kinser et al. | |
| 2014/0312009 A1* | 10/2014 | Okabe | C22C 38/001 219/121.29 |
| 2014/0347641 A1 | 11/2014 | Koek et al. | |
| 2015/0024317 A1 | 1/2015 | Orrock et al. | |
| 2015/0024319 A1 | 1/2015 | Martin | |
| 2015/0086705 A1* | 3/2015 | Meinders | C23C 14/28 427/8 |
| 2015/0097316 A1* | 4/2015 | DeSimone | G03F 7/0037 264/401 |
| 2015/0167147 A1 | 6/2015 | Schupp et al. | |
| 2015/0197063 A1 | 7/2015 | Shinar et al. | |
| 2015/0197862 A1 | 7/2015 | Engel et al. | |
| 2015/0259783 A1* | 9/2015 | Lai | G21K 5/10 427/597 |
| 2015/0328838 A1 | 11/2015 | Erb et al. | |
| 2015/0346483 A1* | 12/2015 | Ehrmann | G02B 26/101 219/121.85 |
| 2015/0375456 A1* | 12/2015 | Cheverton | B29C 64/153 264/406 |
| 2015/0382476 A1* | 12/2015 | Zenou | H05K 3/02 427/510 |
| 2016/0114425 A1* | 4/2016 | Liu | B23K 26/0624 65/17.3 |
| 2016/0187646 A1* | 6/2016 | Ehrmann | G02B 13/0095 219/121.73 |
| 2016/0218287 A1 | 7/2016 | McAlpine et al. | |
| 2016/0233089 A1* | 8/2016 | Zenou | H05K 3/1241 |
| 2016/0336303 A1 | 11/2016 | Tsai | |
| 2017/0189995 A1* | 7/2017 | Zenou | H01C 17/06 |
| 2017/0210142 A1 | 7/2017 | Kotler et al. | |
| 2017/0306495 A1* | 10/2017 | Kotler | B23K 26/0648 |
| 2017/0365484 A1* | 12/2017 | Kotler | C23C 14/048 |
| 2018/0193948 A1* | 7/2018 | Zenou | G03F 7/16 |

FOREIGN PATENT DOCUMENTS

| | | |
|---|---|---|
| EP | 2660352 A1 | 11/2013 |
| GB | 2453774 A | 4/2009 |
| JP | S4960538 A1 | 6/1974 |
| JP | H0634283 | 2/1994 |
| JP | 3871096 B2 | 1/2007 |
| JP | 2015144252 A | 8/2015 |
| WO | 2003056320 A2 | 7/2003 |
| WO | 2007134300 A2 | 11/2007 |
| WO | 2010100635 A1 | 9/2010 |
| WO | 2013023874 A1 | 2/2013 |
| WO | 2013080030 A1 | 6/2013 |
| WO | 2013124114 A1 | 8/2013 |
| WO | 2013165241 A1 | 11/2013 |
| WO | 2013182367 A1 | 12/2013 |
| WO | 2014061024 A1 | 4/2014 |
| WO | 2015003404 A1 | 1/2015 |
| WO | 2015056253 A1 | 4/2015 |
| WO | 2015155662 A1 | 10/2015 |
| WO | 2015181810 A1 | 12/2015 |
| WO | 2016063270 A1 | 4/2016 |
| WO | 2016116921 A1 | 7/2016 |
| WO | WO-2016116921 A1 * | 7/2016 ........ B23K 26/0648 |
| WO | 20160124708 A1 | 8/2016 |
| WO | 20160124712 A3 | 8/2016 |
| WO | 2017006306 A1 | 1/2017 |

OTHER PUBLICATIONS

U.S. Appl. No. 15/524,282 office action dated Sep. 27, 2018.

Frohlich et al., "A two-frequency acousto-optic modulator driver to improve the beam pointing stability during intensity ramps", Review of Scientific Instruments, vol. 78, pp. 043101/1-4, Apr. 2, 2007.

Singh et al., "Suppression of FWM Crosstalk on WDM Systems Using Unequally Spaced Channel Algorithms—A Survey", International Journal of Advanced Research in Computer Science and Software Engineering, vol. 3, Issue 12, pp. 25-31, Dec. 2013.

Wadhwa et al., "Golomb Ruler Sequence Generation and Optimization using Modified Firefly Algorithm", SSRG International Journal of Electronics and Communication Engineering (SSRG-IJECE), vol. 1, issue 5, 8 pages, Jul. 2014.

(56) References Cited

OTHER PUBLICATIONS

Isomet Corp., 'Acousto-Optic Modulation', Application Note—AN0510, 13 pages, Jan. 27, 2014.

Gazalet et al., "Acousto-optic multifrequency modulators: reduction of the phase-grating, intermodulation products", Applied Optics, vol. 32, No. 13, pp. 2455-2460, May 1, 1993.

U.S. Appl. No. 15/644,857 office action dated Aug. 1, 2018.

Grant-Jacob et al., "Micron-scale copper wires printed using femtosecond laser-induced forward transfer with automated donor replenishment", Optical Materials Express, vol. 3, No. 6, pp. 747-754, Jun. 1, 2013.

Eason et al., "Nanofabrication technologies: high-throughput for tomorrow's metadevices", Conference paper, University of Southampton, UK, 50 pages, Jan. 2014.

Xiao., "Nanosecond Laser Assisted Fabrication of Large Area Metallic Nanostructures and Their Potential Applications", Thesis dissertation, University of California, Los Angeles, 98 pages, 2015.

Pique et al., "Laser Forward Transfer of Electronic and Power Generating Materials", Laser Ablation and its Applications, Chapter 14, pp. 339-373, Dec. 31, 2007.

Young et al., "Dielectric properties of oxide structures by a laser-based direct-writing method", Journal of Materials Research, vol. 16, No., pp. 1720-1725, Jun. 30, 2001.

Nagel et al., "Laser-Induced Forward Transfer for the Fabrication of Devices", Nanomaterials: Processing and Characterization with Lasers, First Edition, pp. 255-316, year 2012.

Papavlu et al.,"Laser Induced Forward Transfer for Materials Patterning", Romanian Reports in Physics, vol. 63, supplement, pp. 1285-1301, year 2011.

Zergioti et al., "Microdeposition of metals by femtosecond excimer lase", Applied Surface Science, vols. 127-129, pp. 601-605, year 1998.

Vispute et al., "Reactive deposition of YlBa2Cu3O 7-x superconductor films by pulsed laser ablation from an unreacted mixture of Y2O3, BaCO 3 and CuO", Bulletin of Materials Science, vol. 15, No. 4, pp. 377-384, Aug. 1992.

Hecht.,"Multifrequency Acoustooptic Diffraction," IEEE Transactions on Sonics and Ultrasonics, vol. SU-24, No. 1, pp. 7-18, year 1977.

Trypogeorgos et al., "Precise shaping of laser light by an acousto-optic deflector", Optics Express, vol. 21, No. 21, pp. 24837-24846, Oct. 21, 2013.

Tan et al., "Selective surface texturing using femtosecond pulsed laser induced forward transfer", Applied Surface Scienc, vol. 207, pp. 365-371, year 2003.

Adrian et al., "A study of the mechanism of metal deposition by the laser-induced forward transfer process", Journal of Vacuum Science and Technology B, vol. 5, No. 5, pp. 1490-1494, Sep./Oct. 1987.

Baseman.,"Formation of Metal Silicon Alloys by Laser Induced Forward Transfer", An IP.com Prior Art Database Technical Disclosure, 2 pages, Jul. 1, 1988.

Gehner., "MEMS Adaptive Optics Development at IPMS", Fraunhofer, Feb. 15, 2007.

Kumpulainen et al., "Low Temperature Nanoparticle Sintering with Continuous Wave and Pulse Lasers", Optics & Laser Technology 43, pp. 570-576, year 2011.

Theodorakos et al., "Selective Laser Sintering of Ag Nanoparticles Ink for Applications in Flexible Electronics", Applied Surface Science 336, pp. 157-162, 2015.

Wang et al., "Silicon solar cells based on all-laser-transferred contacts", Progress in Photovoltaics: Research and Applications, 23, pp. 61-68 Jul. 19, 2013.

Willis et al., "Microdroplet deposition by laser-induced forward transfer", Applied Physics Letters, vol. 86, pp. 244103-1-244103-3, year 2005.

Antonov., "Angular Splitting of the Bragg Diffraction Order in an Acoustooptical Modulator Due to a Frequency-Modulated Acoustic Wave", Technical Physics, vol. 50, No. 4, pp. 513-516, year 2005.

Banks et al., "Nanodroplets deposited in microarrays by femtosecond Ti:sapphire laser-induced forward transfer", Applied Physics Letters, vol. 89, pp. 193107-1-193107-3, year 2006.

Antonov., "Acoustooptic Nonpolar Light Controlling Devices and Polarization Modulators Based on Paratellurite Crystals", Technical Physics, vol. 49, No. 10, pp. 1329-1334, year 2004.

Antonov et al., "Improving the Efficiency of an Acoustooptic Modulator with a Two-Lobe Directivity Pattern by Correcting the Two-Frequency Electric Signal", ISSN 1063-7842, Technical Physics, vol. 51, No. 1, pp. 57-62, year 2006.

Antonov et al., "Inverse Acoustooptic Problem: Coherent Summing of Optical Beams into a Single Optical Channel", ISSN 1063-7842, Technical Physics, vol. 52, No. 5, pp. 610-615, year 2007.

Antonov et al., "Efficient Multiple-Beam Bragg Acoustooptic Diffraction with Phase Optimization of a Multifrequency Acoustic Wave", ISSN 1063-7842, Technical Physics, vol. 52, No. 8, pp. 1053-1060, year 2007.

Antonov et al., "Formation of the Multibeam Pattern of the Bragg Diffraction of Light by a Periodically Phase Modulated Acoustic Signal", ISSN 1064-2269, Journal of Communications Technology and Electronics, vol. 53, No. 4, pp. 453-459, year 2008.

Antonov et al., "Highly Effective Acoustooptic Diffraction of Light by Multifrequency Sound Using a Nonaxial Deflector", ISSN 1063-7842, Technical Physics, vol. 53, No. 6, pp. 752-756, year 2008.

Antonov et al., "Switch multiplexer of fiber-optic channels based on multibeam acousto-optic diffraction", Applied Optics, vol. 48, No. 7, pp. C171-C181, Mar. 1, 2009.

Zenou et al., "Laser Transfer of Metals and Metal Alloys for Digital Microfabrication of 3D Objects", Small, vol. 11, issue 33, pp. 4082-4089, Sep. 2, 2015.

Zenou et al., "Solar cell metallization by laser transfer of metal micro-droplets", ScienceDirect, Energy Procedia, vol. 67, pp. 147-155, year 2015.

Bera et al., "Optimization study of the femtosecond laser-induced forward-transfer process with thin aluminum films", Applied Optics, vol. 46, No. 21, pp. 4650-4659, Jul. 20, 2007.

Li et al., "Microdroplet deposition of copper film by femtosecond laser-induced forward transfer", Applied Physics Letters, vol. 89, pp. 161110-4-161110-4, year 2006.

Roder et al., "Low Temperature Laser Metallization for Silicon Solar Cells", ScienceDirect, Energy Procedia, vol. 8, pp. 552-557, year 2011.

Tien et al., "Precision laser metallization", Microelectronic Engineering, vol. 56, pp. 273-279, year 2001.

Fraunhofer IPMS, Spatial Light Modulators (SLM), 2 pages, Jun. 7, 2016.

Fraunhofer IPMS, "Micro Mirror Arrays (MMA) from DUV to NIR", 2 pages, Jun. 7, 2016.

Gehner et al., "Mems AO Micro Mirror Development at IPMS", Status and Perspectives, Fraunhofer IPMS, 30 pages, May 4, 2016.

BWT Beijing, "K915FG2RN-150.0W, 915nm 150W High Power Fiber Coupled Diode Laser", 4 pages, Jul. 1, 2016.

Zenou et al., "Digital laser printing of aluminum microstructure on thermally sensitive substrates", Journal of Physics D: Applied Physics 48, 205303 12 pages, 2015.

Willis et al., "The effect of melting-induced volumetric expansion on initiation of laser-induced forward transfer", Applied Surface Science 253, pp. 4759-4763, 2007.

Schultze et al., "Laser-induced forward transfer of aluminium", Applied Surface Science 52, pp. 303-309, 1991.

Pique, A., "Laser Transfer Techniques for Digital Microfabrication", vol. 135 of the series Springer Series in Materials Science, Chapter 11, pp. 259-291, Jun. 30, 2010.

Bohandy et al., "Metal deposition from a supported metal film using an excimer laser", Journal of Applied Physics, vol. 60, No. 4, pp. 1538-1539, Aug. 15, 1986.

U.S. Appl. No. 15/644,857 office action dated Jan. 9, 2019.

Japanese patent application No. 2017-504395 office action dated Jan. 29, 2019.

Baseman et al., "Laser Induced Forward Transfer", Proceedings of Materials Research Society Symposium, vol. 101, pp. 237-242, year 1988.

(56) References Cited

OTHER PUBLICATIONS

TW Application # 104137228 office action dated May 3, 2019.
CN Application # 201680040497.7 office action dated Apr. 17, 2019.
U.S. Appl. No. 15/644,857 office action dated Jun. 24, 2019.
CN Application # 201680065145.7 office action dated Aug. 2, 2019.
JP Application # 2017-517354 office action dated Aug. 28, 2018.

* cited by examiner

CONTROL OF LIFT EJECTION ANGLE

FIELD OF THE INVENTION

The present invention relates generally to laser-induced material printing, and particularly to methods and system for printing at a controlled ejection angle.

BACKGROUND OF THE INVENTION

In laser direct-write (LDW) techniques, a laser beam creates a patterned surface with spatially-resolved three-dimensional structures by controlling material ablation or deposition. Laser-induced forward transfer (LIFT) is an LDW technique that can be applied in depositing micro-patterns on a surface. LIFT is a technology for high quality printing of various materials such as metals and polymers. Examples of prior art techniques are provided below.

PCT International Publication WO 2013/165241, to Meinders, et al., whose disclosure is incorporated herein by reference, describes a light induced forward transfer manufacturing method for transfer of material from a donor sheet. A donor sheet is used that comprises a trench in a surface of the donor sheet, with transfer material in the trench. The material is transferred by scanning a light spot along the bottom of the trench.

Further examples of metal jetting using LIFT are provided by Willis et al., in "Microdroplet deposition by laser-induced forward transfer," Appl. Phys. Lett. 86, 244103 (2005); by Willis et al., in "The effect of melting-induced volumetric expansion on initiation of laser-induced forward transfer," Appl. Surf. Sci., 253:4759-4763 (2007); and by Banks et al., in "Nanodroplets deposited in microarrays by femtosecond Ti:sapphire laser-induced forward transfer," Appl. Phys. Lett., 89, 193107 (2006), which are all incorporated herein by reference.

Documents incorporated by reference in the present patent application are to be considered an integral part of the application except that, to the extent that any terms are defined in these incorporated documents in a manner that conflicts with definitions made explicitly or implicitly in the present specification, only the definitions in the present specification should be considered.

SUMMARY OF THE INVENTION

An embodiment of the present invention that is described herein provides an apparatus for material deposition on an acceptor surface that includes a transparent donor substrate having opposing first and second surfaces, and a donor film on the second surface. The apparatus additionally includes an optical assembly, which is configured to direct a beam of radiation to pass through the first surface of the donor substrate and impinge on the donor film at a location on the second surface so as to induce ejection of droplets of molten material from the donor film at an angle that is not normal to the second surface at the location onto the acceptor surface.

In some embodiments, the optical assembly is configured to generate an asymmetry in the beam that is selected so as to cause the droplets to be ejected at a selected angle that is not normal to the second surface. In other embodiments, the optical assembly includes an acousto-optic deflector (AOD), which is configured to form the beam of radiation as a plurality of sub-beams exiting from the AOD at respective different angles, the sub-beams together forming a composite beam having the asymmetry. In yet other embodiments, the apparatus further includes a driver circuit, which is configured to input a drive signal having multiple frequencies to the AOD so as to form the sub-beams by diffraction in the AOD.

In an embodiment, the apparatus further includes a processor which is configured to synchronize between the beam of radiation and the multiple frequencies of the drive signal so as to form the composite beam having the asymmetry. In another embodiment, the optical assembly includes a plurality of mirrors, which are configured to form the beam of radiation as a plurality of sub-beams which together form a composite beam having the asymmetry. In yet another embodiment, the optical assembly is configured to introduce the asymmetry into the composite beam by switching-off one or more selected sub-beams using the mirrors.

In some embodiments, the optical assembly is configured to introduce the asymmetry into the composite beam by controlling respective phases of one or more selected sub-beams using the mirrors. In other embodiments, the optical assembly includes a liquid crystal cell array, which is configured to form the beam of radiation as a plurality of sub-beams which together form a composite beam having the asymmetry. In yet other embodiments, the optical assembly is configured to introduce the asymmetry into the composite beam by controlling respective phases of one or more selected sub-beams using cells of the liquid crystal cell array. In alternative embodiments, the donor film has a non-uniformity at a position on the second surface, and the optical assembly is configured to direct the beam to impinge on the donor film in proximity to the position in order to cause the droplets to be ejected at a selected angle that is not normal to the second surface.

In an embodiment, the beam impinging on the donor film is spherically symmetric. In another embodiment, the non-uniformity includes at least one of a hole and a trench in the donor film. In yet another embodiment, the non-uniformity has a predefined shape chosen to cause the droplets to be ejected at the selected angle. In an alternative embodiment, a distance of a point of impingement of the beam from the position is chosen to cause the droplets to be ejected at the selected angle.

In some embodiments, the optical assembly is configured to form the non-uniformity in the donor film using the beam of radiation. In other embodiments, the non-uniformity includes first and second non-uniformities, and the optical assembly is configured to form the second non-uniformity after a formation of the first non-uniformity, and before or after the ejection of the droplets.

There is additionally provided, in accordance with an embodiment of the present invention, a method for material deposition on an acceptor surface including providing a transparent donor substrate having opposing first and second surfaces and a donor film on the second surface. A beam of radiation is directed to pass through the first surface of the donor substrate and impinge on the donor film at a location on the second surface so as to induce ejection of droplets of molten material from the donor film at an angle that is not normal to the second surface at the location onto the acceptor surface.

The present invention will be more fully understood from the following detailed description of the embodiments thereof, taken together with the drawings in which:

DETAILED DESCRIPTION OF EMBODIMENTS

Overview

State-of-the-art electronic devices often comprise 3D structures that conform to a non-flat surface on which they are being built. Such structures are hard to coat, re-pattern (e.g., complete missing structures), or build upon (e.g., add metal pillars). Laser-induced forward transfer (LIFT) techniques provide high quality and cost-effective printing, but are typically limited to ejecting micro-droplets orthogonally to a donor's surface. Thus, a conventional LIFT system is capable of printing micro-droplets on horizontal surfaces of the acceptor but may be incapable of printing on the side-walls of 3D structures at acceptable quality.

Embodiments of the present invention that are described hereinbelow overcome limitations of the prior art, such as those exemplified above, by providing several novel optical assemblies and donor structures, and corresponding methods of operation of LIFT systems. Embodiments of the present invention include printing of both metallic and non-metallic materials.

In some embodiments, a system for material deposition on an acceptor surface comprises a transparent donor substrate having opposing first and second surfaces, and also comprises a donor film on the second surface of the donor. The system further comprises an optical assembly, which is configured to direct a beam of radiation to pass through the first surface of the donor substrate and to impinge on the donor film at a selected location on the second surface of the donor. The beam of radiation is able to induce ejection of droplets of molten material from the donor film, at an angle that is not normal (i.e., not orthogonal) to the second surface of the donor at the selected location.

Typical LIFT techniques require close proximity between the donor and the acceptor (e.g., substantially less than 1 mm), thus the donor and the acceptor are typically positioned parallel to each other. The droplets are ejected from the donor film onto the acceptor surface and may land, typically in the case that the donor and acceptor are parallel, at an angle that is not orthogonal to a top surface of the acceptor, and thus, the system can print the droplets on the side-walls of 3D structures.

In an embodiment, an asymmetric heating profile in the donor film may cause ejection (or jetting) of droplets at the required angle. The disclosed techniques may be used to create the asymmetric heating profile by impinging an asymmetric beam on the donor film, or by introducing some non-uniformity (that causes the asymmetry) in the material of the donor film and impinging a spherically symmetric beam on the donor film. A thermal "nozzle", which reflects the heating asymmetry, is formed in the donor film and creates a pressure gradient in the molten material. The pressure gradient and the asymmetry of the nozzle dictate the jetting angle of the droplet. Thus, controlling the asymmetry in the donor film allows a user to control the jetting angle while the donor is positioned parallel to the acceptor.

In some embodiments the optical assembly is configured to split an incoming beam from a laser into a multiplicity of sub-beams. The sub-beams are typically modulated and directed to the lower surface of the donor so as to form an asymmetric beam on the donor film. The spot asymmetry may be selected so as to cause the droplets to be ejected from the donor film (on the second surface of the donor) at a selected angle that is not normal to the second surface of the donor. In one embodiment, the optical assembly comprises an acousto-optic device which generates multiple output sub-beams that are combined to produce the desired composite asymmetric beam.

In alternative embodiments, the optical assembly may comprise a Micro-Opto-Electro-Mechanical-system (MO-EMS) device having an array of micro-mirrors. The MOEMS device typically controls the rotation or elevation positions of each micro-mirror so as to control the phase or deflection angle of sub-beams produced by the device. By controlling the local phase or direction of the output sub-beams, a user may form various profiles of a composite output beam. Optics of the optical assembly of the present invention may be configured to combine the output sub-beams so as to form the desired asymmetric spot on the donor film.

In an alternative embodiment, the donor film comprises non-uniformity, such as a trench or a hole, in the film. In the alternative embodiment the optical assembly may be configured to direct the beam of radiation, typically in this case a spherically symmetric beam, to impinge on the donor film in proximity to the position of the non-uniformity. The interaction between the beam and the donor film melts the material of the donor film at the impinging position, and the non-uniformity acts as a heat barrier. The heat barrier creates an asymmetric thermal conductivity profile around the melted material, so that the melted material in turn has an asymmetric profile, causing the droplets to be ejected at a non-normal angle to the donor film.

In some embodiments, the system controls the azimuth and size of the ejection angle by selecting a specific proximity between the pattern and the beam. In alternative embodiments, the ejection angle is controlled using a combination of a pattern shape (e.g., a round hole, or a rectangular trench) and the proximity between the pattern and the beam.

The above techniques enable a LIFT system to print on complicated 3D structures, such as side-walls, using simple and cost-effective optical assemblies and flat donor structures. Embodiments using an asymmetric beam may be used to print at a predefined and controlled non-orthogonal angle using any conventional donor. Embodiments using a non-uniformity in the donor film also allow printing at a controlled non-orthogonal angle. The disclosed capabilities may be easily implemented in an operational high volume manufacturing line.

System Description

Figure 1:
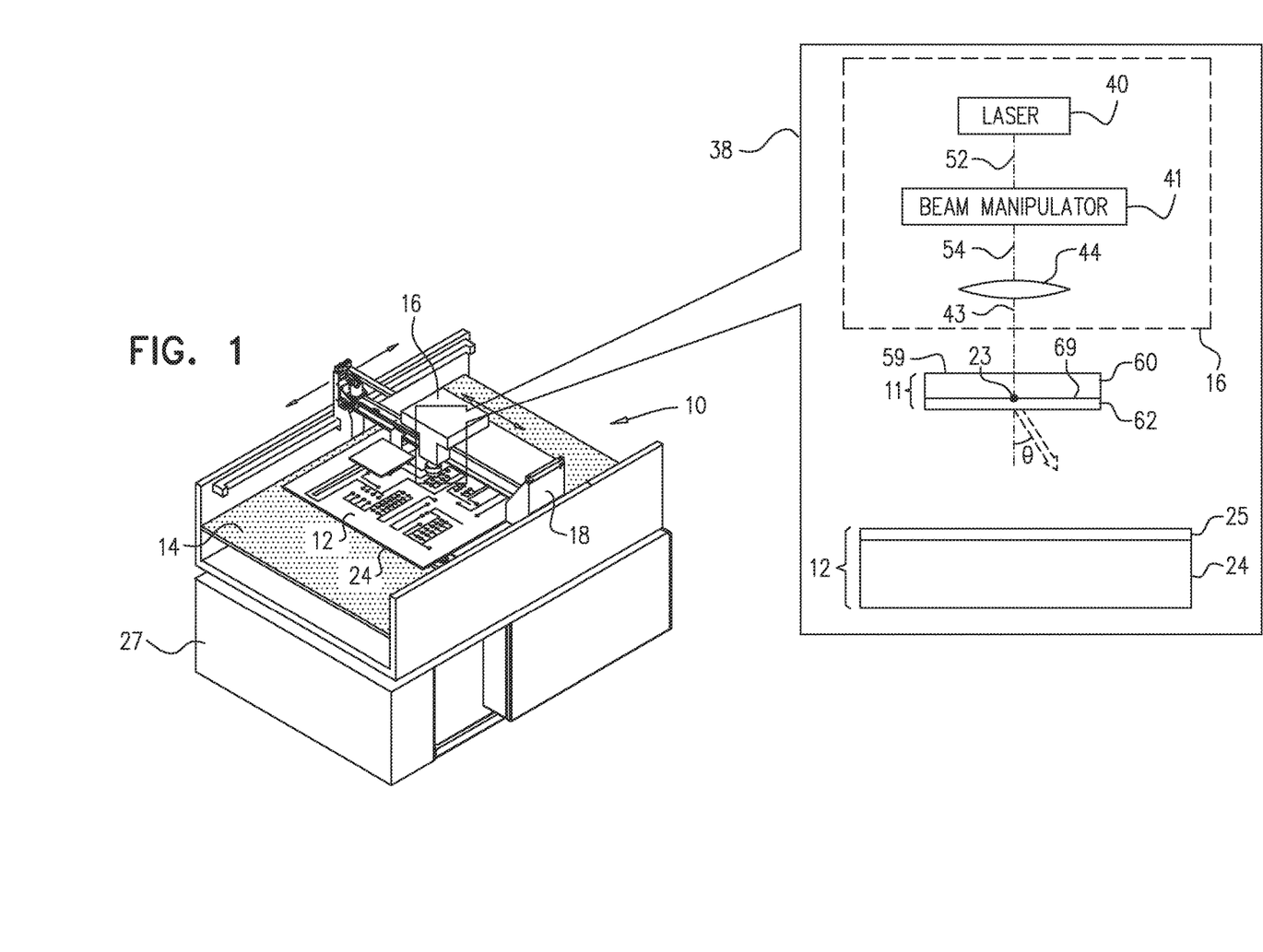
FIG. 1 is a schematic, pictorial illustration of a system for direct writing on a substrate, in accordance with an embodiment of the present invention.

FIG. 1 is a schematic, pictorial illustration of a print and direct write system 10 for writing on a substrate 24, in accordance with an embodiment of the present invention. This system and its components are shown here solely to illustrate the sort of environment in which the techniques described herein may be implemented. Such techniques may similarly be carried out using suitable equipment of other types and in other configurations.

Print and direct write system 10 operates on substrate 24 of an electronic circuit 12, such as a flat panel display (FPD) or a printed circuit board (PCB), which is held on a mounting surface 14. In generic LIFT processes substrate 24 is also termed a receiver or an acceptor. The terms "Flat panel Display", "FPD", "printed circuit board", and "PCB" are used herein to refer generally to any sort of a dielectric or metal or a semiconductor substrate on which conductive materials such as metals, or non-conductive materials such as dielectrics and polymers are deposited, regardless of the type of substrate material and the process used for deposition. System 10 may be used to deposit new layers such as printing metal circuitry on various substrates or in any other electronic devices.

A positioning assembly, in the form of a bridge 18, positions an optical assembly 16 over pertinent sites on substrate 24 in question, by moving assembly 16 linearly along the axes of system 10. In other embodiments, the positioning assembly may be in other forms, such as a moving stage along one (X) axis, two (X, Y) axes, or three (X, Y, Z) axes. A control unit 27 controls the operation of the optical and positioning assemblies, and carries out additional functions such as temperature control, so as to carry out the required printing, patterning and/or other manufacturing operations. Typically, control unit 27 communicates with an operator terminal (not shown), comprising a general-purpose computer including a processor and a display (not shown), along with a user interface and software.

Optical assembly 16 comprises a laser 40 and optics 44 for applying Laser-Induced Forward Transfer (LIFT) techniques from a donor 11. Insert 38 is a schematic side view showing components and modules of optical assembly 16, and a process of ejection of droplets from a donor film 62 at an ejection angle θ that is not normal to a lower surface 69 of donor 11.

Laser 40 emits a pulsed beam 52 into a beam manipulation assembly 41, and assembly 41 is configured to split beam 52 into multiple output sub-beams 54. Sub-beams 54 exit assembly 41 as two or more sub-beams which diverge from one another. Optics 44 converges sub-beams 54 into a composite asymmetric beam 43, and the composite beam is focused by the optics to form a composite asymmetric spot 23 at lower surface 69. The operation of assembly 41 is described in more detail with reference to FIGS. 2A-4B below. Laser 40 may comprise, for example, a pulsed Nd:YAG laser with frequency-doubled output, and the pulse amplitude of the laser may be controlled by control unit 27.

Optics 44 focus asymmetric beam 43 onto donor 11, which comprises a donor substrate 60 on a lower surface of which are deposited one or more donor films 62. Typically, substrate 60 comprises a transparent optical material, such as a glass or plastic sheet. Optics 44 focus beam 43 through a top surface 59 of substrate 60 onto film 62. The asymmetry of spot 23 causes droplets of molten material to be ejected from film 62, at a non-normal ejection angle θ measured with respect to film 62, onto a film 25 of circuit 12. Mechanisms for ejection at a selected angle are described in greater detail with reference to FIGS. 4A-4B and 7A-7C.

Figure 2A:
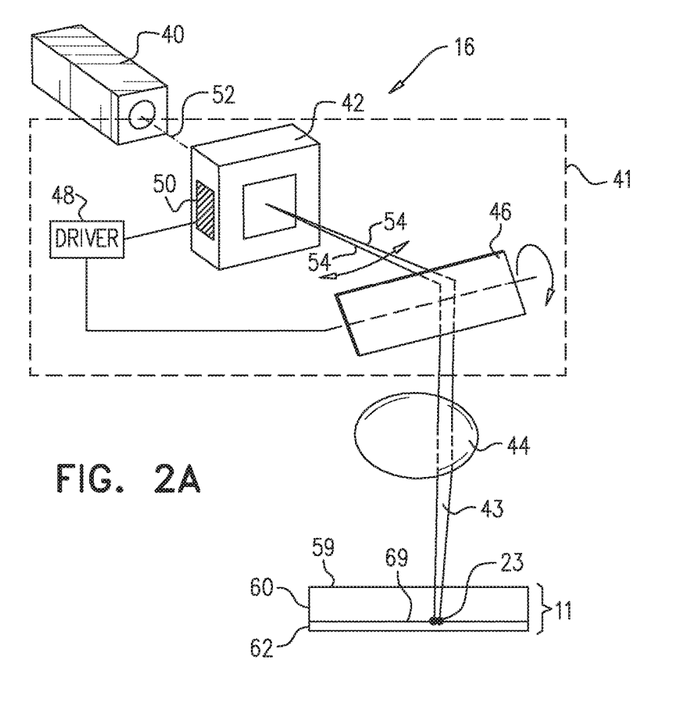
FIG. 2A is a schematic, pictorial illustration showing details of an optical assembly, in accordance with another embodiment of the present invention.

FIG. 2A is a schematic, pictorial illustration showing details of optical assembly 16, in accordance with an embodiment of the present invention. Laser 40 emits beam 52 of optical radiation, which may comprise visible, ultraviolet or infrared radiation. Driver 48 drives multiple signals having close frequencies into an acousto-optic deflector (AOD) 42 of assembly 41. The AOD splits beam 52 into multiple output sub-beams 54, which diffract and diverge from a multi-frequency diffraction grating in the AOD. In an embodiment, scanning mirror 46 deflects sub-beams 54 to optics 44, which focuses sub-beams 54, through substrate 60, to impinge on donor film at adjacent positions determined by the diffraction angles. The diffracted sub-beams 54 form partially overlapping spots at the respective positions when impinging on donor film 62, so as to form an asymmetric beam 43.

In order to generate multiple sub-beams 54, a multi-frequency driver circuit 48 applies a drive signal to a piezoelectric crystal 50, which drives deflector 42 in order to generate acoustic waves in the deflector for splitting beam 52. Although only a single mirror 46 is shown in FIG. 2A, alternative embodiments (not shown in the figures) may employ dual-axis mirrors, which may be scanned together or independently, and/or any other suitable type of beam scanner that is known in the art.

Driver circuit 48 may drive acousto-optic deflector in various different modes in order to generate multiple output beams 54. A number of suitable drive techniques, along with ancillary focusing and scanning optics, that may be adapted for use in optical assembly 24 are described, for example, in U.S. Pat. No. 8,395,083, to Naveh, et al., whose disclosure is incorporated herein by reference. In accordance with one of these techniques, driver circuit 48 generates a multi-frequency drive signal, which causes the acousto-optic deflector to diffract beam 52 into multiple output beams 54 at different, respective angles. Further details of this sort of multi-frequency drive are described by Hecht in "Multifrequency Acoustooptic Diffraction," IEEE Transactions on Sonics and Ultrasonics SU-24, pages 7-18 (1977), which is incorporated herein by reference; and by Antonov et al. in "Efficient Multiple-Beam Bragg Acoustooptic Diffraction with Phase Optimization of a Multifrequency Acoustic Wave," Technical Physics 52:8, pages 1053-1060 (2007), which is likewise incorporated herein by reference.

Figure 2B:
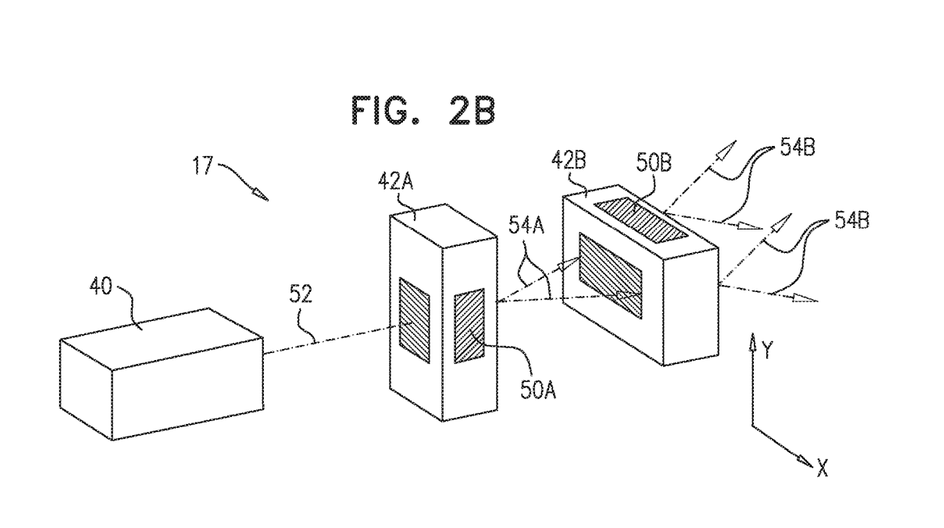
FIG. 2B is a schematic, pictorial illustration of another optical assembly, in accordance with an alternative embodiment of the present invention.

FIG. 2B is a schematic, pictorial illustration of another optical assembly 17, in accordance with an alternative embodiment of the present invention. Assembly 17 may be used in place of assembly 16 in system 10. In assembly 17, a first acousto-optic deflector 42A receives beam 52 from laser 40 and splits beam 52 into multiple sub-beams 54A that may. Deflector 42A separates the sub-beams along the X-axis. The intensity distributions of sub-beams 54A along the X-axis may be symmetrical or asymmetrical. A second acousto-optic deflector 42B is configured to further split one or more of sub-beams 54A into respective sub-beams 54B along the Y-axis. The intensity distributions of sub-beams 54B along the Y-axis may again be symmetrical or asymmetrical.

Driver circuit 48 provides each of deflectors 42A and 42B with multiple drive-signals having close frequencies. The term "close frequencies" refers to a frequency-difference smaller than the frequency resolution $\Delta f$ of system 10, which is given by the ratio Δf=V/D, in which V is the velocity of sound, and D is the size of the aperture.

The disclosed technique uses short-duration laser pulses that are substantially shorter than the time it takes for sound to traverse the optical aperture formed by the diffraction grating of the deflector (also denoted "rise time"). For example, for an aperture width of D=6 mm and assuming sound velocity V of 59000 meter/sec the rise time equals approximately 1.02 microseconds.

Beam 52 that passes through the deflectors may form two or more spots on the surface of the donor that partially overlap one another, so as to form an asymmetric beam. The use of deflectors with signals having close frequencies may generate a two-dimensional (2D) array of asymmetric sub-beams (54A or 54B). Each sub-beam impinges on the donor so as to jet a droplet at a desired angle, which is related to the shape of the asymmetric beam. The 2D array of asymmetric sub-beams may jet multiple droplets simultaneously, wherein droplets created by different sub-beams are jet at angles corresponding to the shape of the respective asymmetric sub-beams.

Figure 6:
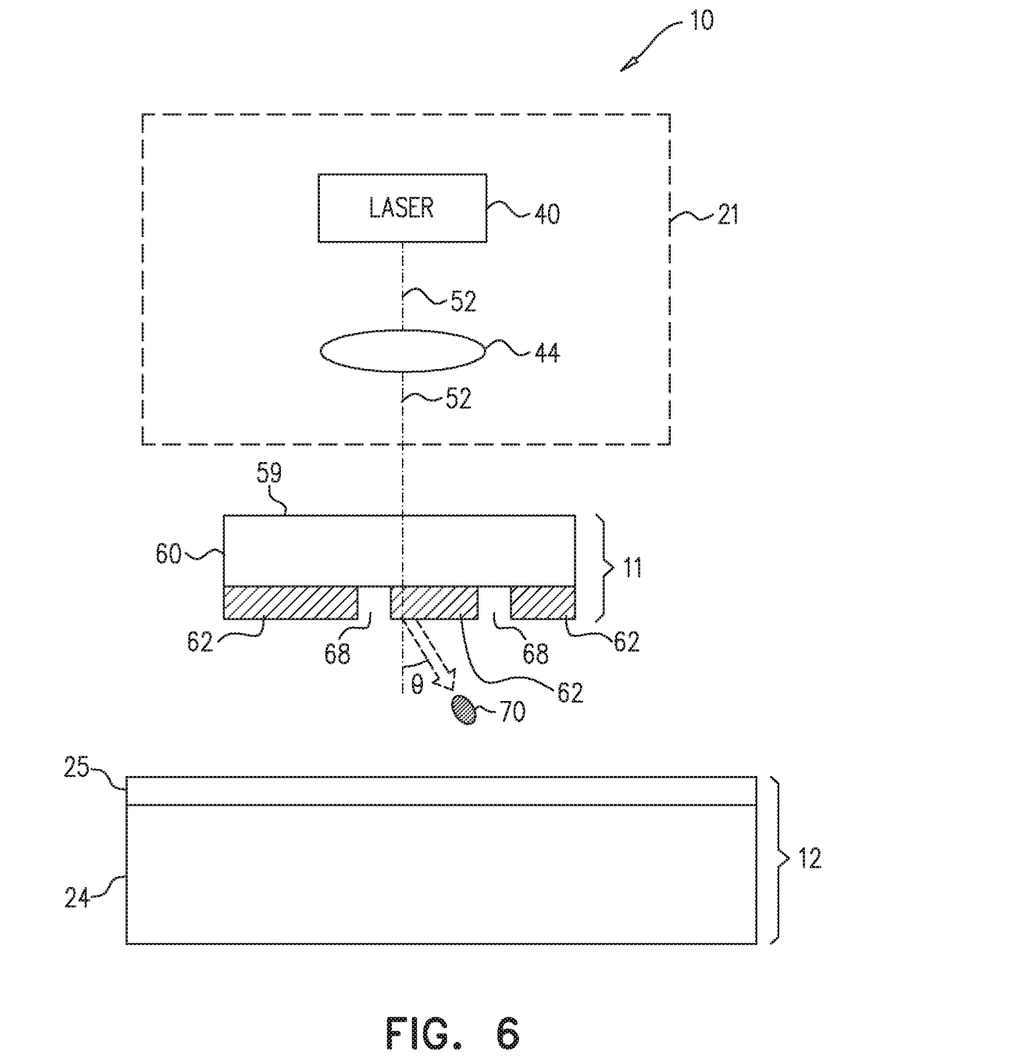
FIG. 6 is a schematic side view illustration of a system for direct writing on a substrate, in accordance with another embodiment of the present invention.

Alternatively, deflector 42A may scan its incoming beam in the X-direction, while deflector 42B is driven to split its incoming beams into multiple asymmetric beams that are separated in the Y-direction. Deflectors 42A and 42B are comprised in assembly 41 and driven by respective piezoelectric crystals 50A and 50B. Compared to assembly 16, assembly 17 provides greater versatility and steering speed, though at the cost of higher beam intensity losses.

Figure 3:
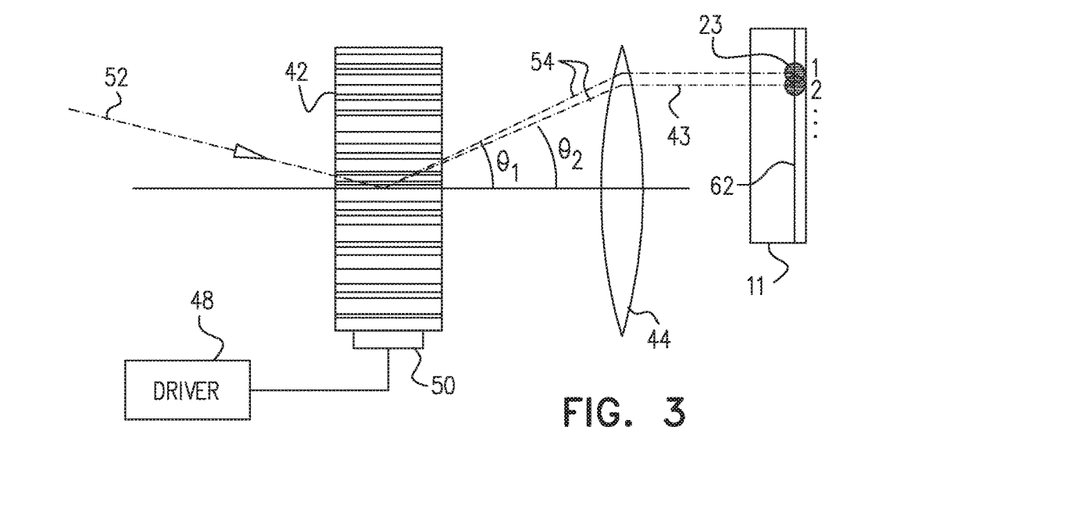
FIG. 3 is a schematic sectional view of an acousto-optic deflector, in accordance with an embodiment of the present invention.

FIG. 3 is a schematic sectional view of acousto-optic deflector 42, in accordance with an embodiment of the present invention. This figure illustrates the effect and operation of a multi-frequency drive, comprising driver circuit 48 and piezoelectric crystal 50. The multi-frequency drive signal from circuit 48 causes piezoelectric crystal 50 to generate acoustic waves at the multiple drive frequencies, which propagate through the acousto-optic crystal in deflector 42. Each of the different drive frequencies establishes an acousto-optic diffraction grating in the deflector at a corresponding spatial frequency, i.e., the deflector contains multiple superposed gratings with different spacings.

When beam 52 enters deflector 42, each of the gratings in the crystal diffracts beam 52 at a different angle, depending on the grating spacing. Thus, deflector 42 splits beam 52 into multiple sub-beams 54 at different angles $\theta_1$, $\theta_2$, ..., corresponding to different frequencies f1, f2, ... provided by crystal 50. For example, two drive-signals having close frequencies driven into deflector 42 cause the formation of two adjacent diffracted sub-beams that partially overlap when impinging on donor film 62, so as to form an asymmetric beam 43.

In addition to providing multiple frequencies f1, f2, driver circuit 48 is configured to provide respective amplitudes of the frequencies, so as to control the intensity of the corresponding sub-beams 54 generated by each pulse of beam 52. As is explained in more detail below, circuit 48 controls the intensity of the sub-beams by modulating the amplitudes of the signals at the corresponding frequencies in appropriate synchronization with the pulses of beam 52. More particularly, driver circuit 48 may turn the corresponding frequency components on and off in order to choose the combination of output beams 54 to generate at each pulse.

Figure 4A:
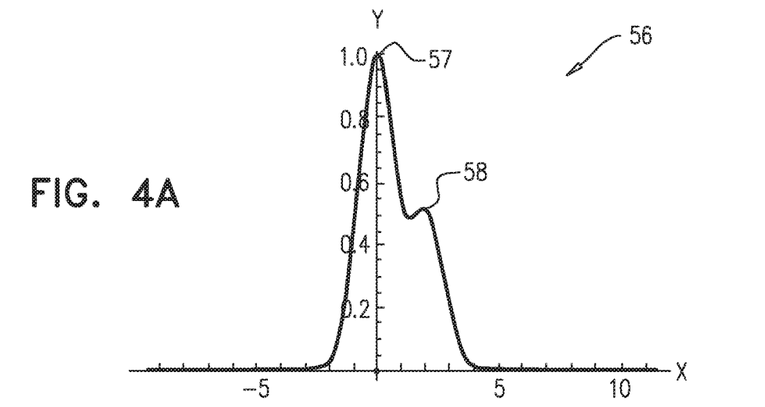
FIGS. 4A and 4B are graphs of asymmetric beam profiles, in accordance with embodiments of the present invention.

FIG. 4A is a schematic graph of an asymmetric beam profile 56 of spot 23, in accordance with an embodiment of the present invention. Profile 56 is a cross-section of spot 23, along a line defined by the direction of deflector 42, that plots intensity y vs. distance x across the spot. Beam profile 56 comprises two peaks representing two respective output sub-beams 54 shown in FIG. 3. A peak 57 corresponds to a first output sub-beam 54 deflected at an angle $\theta_1$. A peak 58 corresponds to a second output sub-beam 54 deflected at an angle $\theta_2$. The first and second output beams 54 are formed by a predefined set of corresponding frequencies (f1, f2), amplitudes (A1, A2) and phases (p1, p2) applied by driver circuit 48 to deflector 42.

It will be understood that when the first and second sub-beams 54 are focused to spot 23, the difference between the values of f1 and f2 results in small positional shifts of the peaks of the two beams at the spot, and thus creates the asymmetric profile shown in the graph.

Typically, when applying signals comprising two close frequencies to deflector 42, the acoustic signal within deflector 42 is modulated with a period given by the frequency difference between the two signals, thus, generating constructive and destructive interference. In order to obtain maximum diffraction efficiency, control unit 27 is configured to synchronize the pulse of laser with the constructive interference occurring in deflector 42. In addition, the temporal width of the laser pulse must be substantially smaller than the modulation period, so that the laser pulse synchronizes with the constructive interference.

Figure 4B:
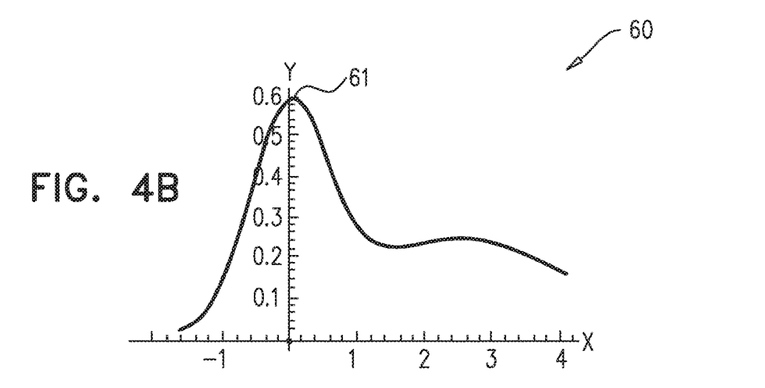

FIG. 4B is another graphic example of an asymmetric profile 60 of spot 23, in accordance with an embodiment of the present invention. Beam profile 60 is formed by first, second and third sub-beams 54, and comprises a single peak 61. To generate the profile shown, driver circuit 48 generates three frequencies f1, f2, and f3 that are input by crystal 50 into deflector 42, so as to generate the corresponding first, second and third sub-beams. Driver circuit 48 also sets amplitudes A1, A2, and A3, corresponding to frequencies f1, f2, and f3. The profile is generated when amplitudes A2 and A3 are equal (A2=A3), and amplitude A1 equals to A2+A3. In addition, the differences between the frequencies are f1−f2=2*(f2−f3). From consideration of FIGS. 4A and 4B, it will be understood that a user of system 10 may design a desired shape of an asymmetric beam, and the asymmetric spot generated by the beam, by selecting pre-defined sets of pulses with specific sets of corresponding frequencies and amplitudes.

As shown below optical assembly 16 may be configured to modify or refresh the shape of spot 23 at a high rate that corresponds to high repetition rate lasers, such as laser 40, which typically refresh at rates of 1 MHz or less.

If the spatial pulse width of laser 40 is D, then the time taken, $t_T$, for the acoustic wave in AOD 42 to transit the pulse width is given by equation (1):

$$t_T = \frac{D}{v_s} \qquad (1)$$

where $v_s$ is the acoustic wave velocity in the AOD.

The wavelength λ in the AOD is given by equation (2):

$$\lambda = \frac{v_s}{F} \qquad (2)$$

where F is the frequency of the acoustic wave.

For effective diffraction by the AOD, the width D of the optical pulse should cover a large number of waves in the diffraction grating generated in the AOD, i.e., $$D \gg \lambda, \text{ or } D \gg \frac{v_s}{F} \quad (3)$$

Combining equations (1) and (3) gives:

$$t_T \gg \frac{1}{F} \quad (4)$$

Since F for an AOD may be 200 MHz or higher, a transit time $t_T$ for 20 waves (for example) in an AOD driven at 200 MHz is $10^{-7}$ s. This transit time corresponds to a laser refresh rate of 10 MHz, which is an order of magnitude greater than the typical rate of 1 MHz cited above. Thus, embodiments of the present invention allow substantially higher refresh rates for laser 40 than are typical. The above description and numerical values are given purely by way of example. Any other suitable operational scheme, laser parameters, or other numerical values can be used in alternative embodiments.

Figure 5:
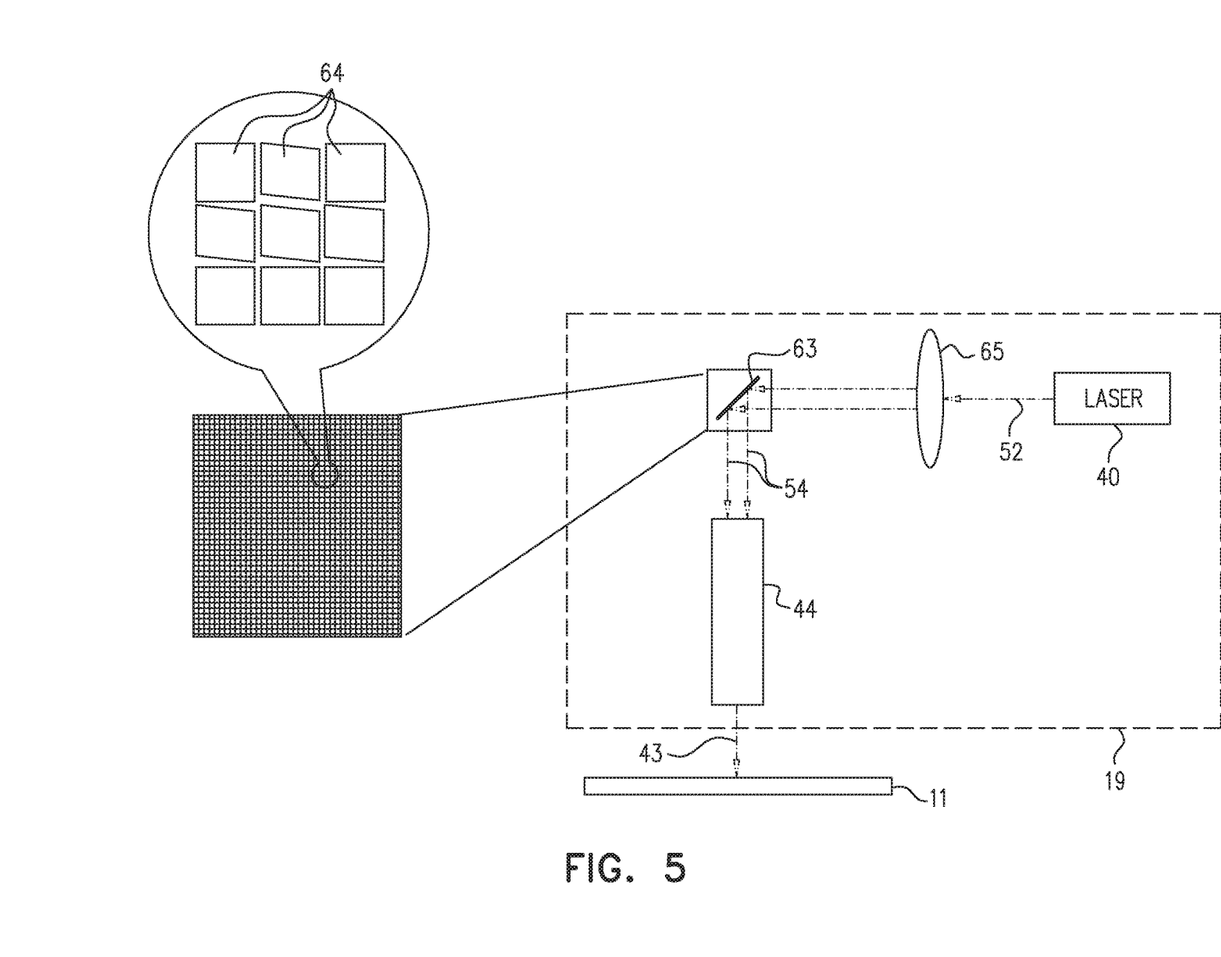
FIG. 5 is a schematic, pictorial illustration of an alternative optical assembly, in accordance with an alternative embodiment of the present invention.

FIG. 5 is a schematic, pictorial illustration of an alternative optical assembly 19, in accordance with an alternative embodiment of the present invention. Assembly 19 may be used in place of assembly 16 in system 10. Laser 40 emits beam 52 into a beam expander 65, which expands and collimates beam 52 over an array of micro-mirrors 64 comprised in a Micro-Electro-Mechanical-system (MEMS) device 63.

MEMS devices such as MEMS device 63 are commercially available from multiple manufacturers, such as micro-mirror products manufactured by Fraunhofer Institute, Munich, Germany, and may also be denoted MOEMS (Micro-Opto-Electro-Mechanical-System). Devices of this sort are described, for example, by Gehner, in "MEMS Adaptive Optics Development at IPMS," 2007, which is incorporated herein by reference.

Device 63 typically comprises one or more arrays of micro-mirrors 64 (e.g., one million micro-mirrors 64, in a mega-pixel device), and typically controls rotation or elevation of each micro-mirror 64 in the array. In some embodiments, the optical assembly is configured to switch off one or more of sub-beams 54 by rotating the respective micro-mirrors to a suitable rotation angle. This technique is widely used (for example by Texas Instruments) and allows the formation of asymmetric beams with desired intensity shapes by switching off certain micro-mirrors. Typically, rotation control of each micro-mirror 64 enables control of the deflection angle of each sub-beam 54, at high resolution. Optics 44 focus sub-beams 54 to form composite asymmetric beam 43, and beam forms spot 23 on film 62, as already described with respect to FIG. 3.

In other embodiments, the optical assembly is configured to control the elevation of one or more of micro-mirrors 64, thereby adjusting the optical lengths of the paths traversed by the respective sub-beams. This adjustment varies the relative phase between sub-beams, so as to form the desired beam profile. This technique was developed by Fraunhofer Institute (denoted IPMS). The micro-mirror-based techniques allow device 63 to serve as a high spatial resolution Spatial Light Modulator.

In yet other embodiments, alternatively to MEMS device 63, assembly 19 may comprise a liquid crystal cell array, such as Liquid Crystal on Silicon Spatial Light Modulator (LCOS-SLM), for asymmetric beam shaping. Each cell in the liquid crystal cell array is controlled electrically, so as to create a distinct phase delay for the reflected sub-beam. Such SLM devices are provided, for example, by Hamamatsu Photonics K.K. (Hamamatsu city, Japan).

The methods described above for producing an asymmetric spot on a donor film are by way of example, and other methods for producing an asymmetric spot will be apparent to those having ordinary skill in the art. All such methods are included in the scope of the present invention.

The configurations of assemblies 16, 17, 19 (and assembly 21 shown in FIG. 6) and their respective optical paths are simplified configurations that are selected purely by way of example for the sake of clarity. In alternative embodiments, any other suitable configuration and optical path can be used for the optical assemblies. For example, in assembly 19 beam 52 may be projected at an angle other than 45° on device 63 so as to improve the intensity of beams 54.

FIG. 6 is a schematic side view illustration of a system 13, in accordance with another embodiment of the present invention. Apart from the differences described below, the operation of system 13 is generally similar to that of system 10, and elements indicated by the same reference numerals in both systems 13 and 10 are generally similar in construction and in operation. In system 13 an optical assembly 21 comprises laser 40 which directs beam 52 into optics 44. Optics 44 focus beam 52 through top surface 59 of substrate 60 onto film 62. In contrast to system 10, beam 52 in system 13 is typically spherically symmetric along its entire optical path, including when it impinges on film 62. Also in contrast to system 10, in system 13 film 62 is non-uniform, as is described in more detail below.

Film 62 comprises one or more non-uniformities 68 comprising trenches or holes patterned in film 62. In some embodiments, non-uniformities 68 are patterned in film 62 during a preparation process of donor 11. Once film 62 comprises all designed non-uniformities 68, the donor is mounted on the system so as to start the LIFT printing process as described above.

In alternative embodiments, film 62 may be patterned during the LIFT process. Donor 11 is mounted on the system before film 62 is being patterned, or is partially patterned with non-uniformities 68. Laser 40 is configured to jet material from film 62, typically by using a different irradiation regime, so as to form one or more non-uniformities 68. In an embodiment, the laser forms the non-uniformities before starting the LIFT printing process. In another embodiment, the laser may complete part of the LIFT process (e.g., covering a first area of the donor) and then pattern additional non-uniformities 68 (e.g., in a different area of the donor). This capability allows a user to adapt the pattern (e.g., layout of the non-uniformities) to the printing process requirements and may also allow better utilization of the material in film 62 by optimizing the non-uniformities 68 patterns to meet the LIFT printing requirements.

In operation, optical assembly 21 may be configured to direct beam 52, herein assumed to be a spherically symmetric beam, to impinge on film 62 in proximity to the position of a given non-uniformity in film 62. The interaction between beam 52 and film 62 melts the material of film 62 at the impinging position, and the non-uniformity acts as a heat barrier. The heat barrier creates an asymmetric thermal conductivity profile around the melted material, so that the melted material in turn has an asymmetric profile. As a result, droplets 70 are ejected from film 62, at non-normal ejection angle θ, onto film 25 of circuit 12, and may land, typically in the case that the donor and acceptor are parallel, at an angle that is not orthogonal to the top surface of film 25. The non-normal ejection process and mechanism are described with more detail with reference to FIGS. 7A-7C.

Figure 7A:
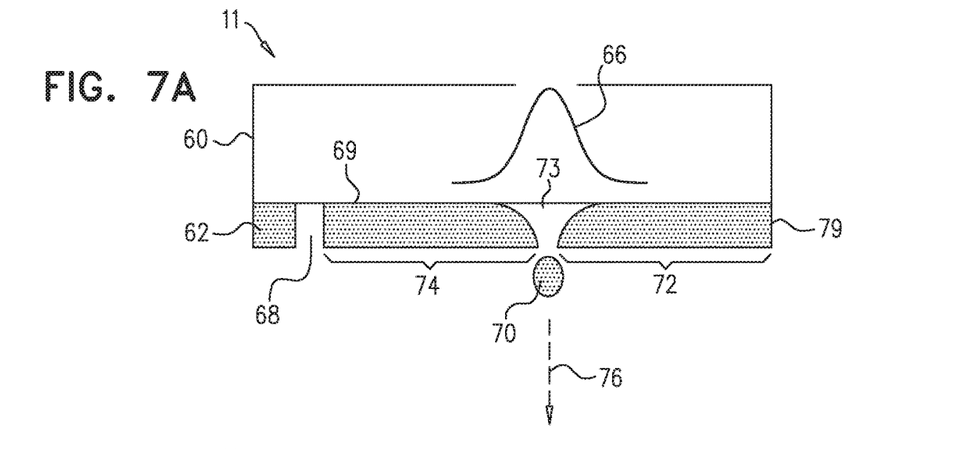
FIGS. 7A-7C are schematic illustrations of a droplet as ejected from a donor, in accordance with embodiments of the present invention.
Figure 7B:
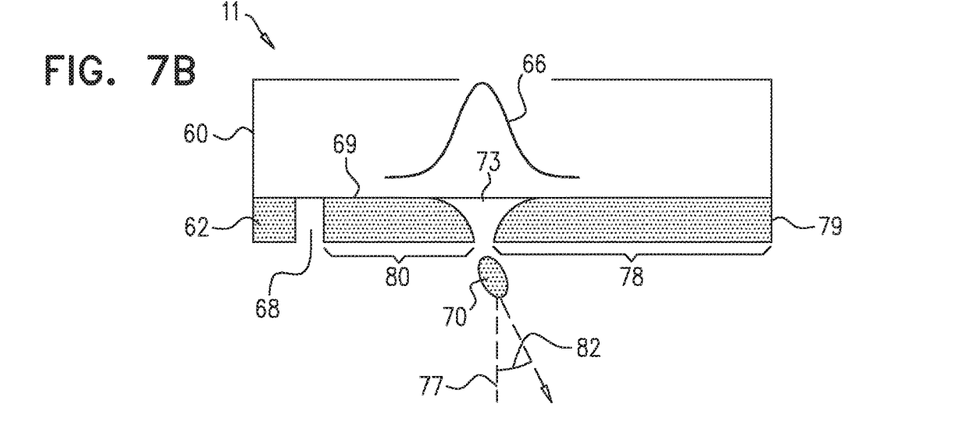
Figure 7C:
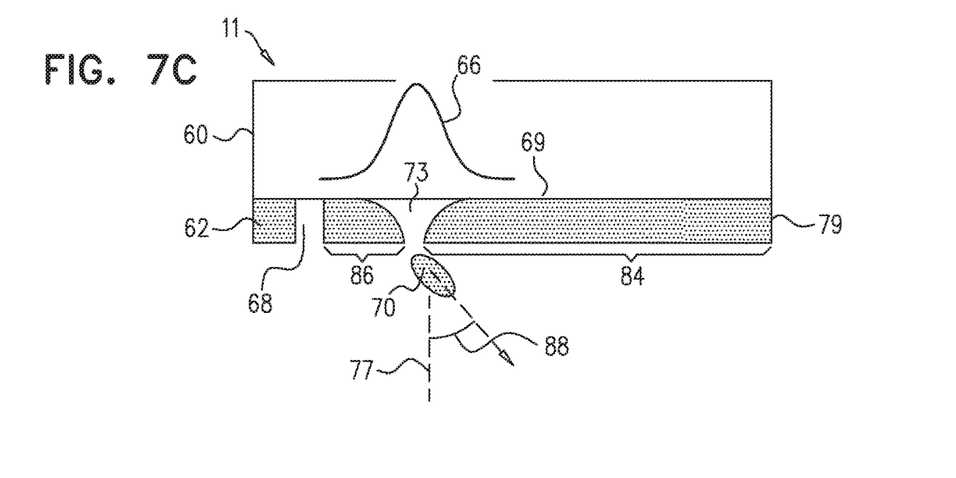

FIGS. 7A-7C are schematic illustrations of droplet 70 as ejected from film 62, in accordance with an embodiment of the present invention. In the figures, donor 11 comprises substrate 60, which is transparent to beam 52, and non-uniform film 62, which comprises one or more holes 68. In all three diagrams optical assembly 21 is assumed to direct beam 52, which has a spherically symmetric beam profile 66, to impinge on film 62 at a location 73.

The interaction between beam 52 and film 62 melts the material of film 62 at location 73 and forms a thermal "nozzle." The thermal nozzle (typically metal) in film 62 dissipates heat through film 62 and to the surrounding environment (e.g., air) around the film.

FIG. 7A illustrates the case when a given hole 68 is far enough from location 73 so that the hole does not affect the heat dissipation from the thermal nozzle at location 73. In this case film regions 72 and 74, where heat is dissipated, surround location 73. Regions 72 and 74 are of equal size and are located symmetrically with respect to location 73, so that there is a symmetric thermal profile (not shown) around the thermal nozzle. Due to the symmetric thermal profile, droplet 70 that is formed at location 73 by expulsion from the thermal nozzle ejects, in a direction 76, that is orthogonal to lower surface 69 of substrate 66.

FIG. 7B illustrates the case when given hole 68 is close enough to location 73 so that the hole does affect the heat dissipation from the thermal nozzle at location 73. As described above with reference to FIG. 7A, film 62 conducts heat which dissipates from the film. A film region 80 is located to the left of location 73, and comprises the material of film 62 between the thermal nozzle formed at location 73, and hole 68. A region 78 is located to the right of location 73, and comprises the material of film 62 between the thermal nozzle formed at location 73, and a right edge 79 of film 62. Regions 80 and 78 dissipate heat. However, region 80 is smaller than region 78, so that heat dissipates from region 80 at a different rate than from region 78, thus, creating an asymmetric thermal profile (not shown) around the thermal nozzle at location 73. The asymmetric thermal profile causes droplet 70 to be ejected at a non-zero angle 82, measured relative to a normal 77 of surface 69.

FIG. 7C illustrates the case when given hole 68 is closer to location 73 than the situation of FIG. 7B. As for the situation in FIG. 7B, the location of the hole illustrated in FIG. 7C does affect the heat dissipation from the molten material at location 73. A region 86 is located to the left of location 73, and comprises the material of film 62 between location 73 and hole 68. A region 84 is located to the right of location 73, and comprises the material of film 62 between location 73 and right edge 79 of film 62. Because regions 86 and 84 have a greater difference in area than the difference between regions 80 and 78 (FIG. 7B), the thermal profile (not shown) around location 73 in FIG. 7C is more asymmetric compared to that of FIG. 7B. The higher asymmetry of the thermal profile in FIG. 7C causes droplet 70 to be ejected at non-zero angle 88 that is larger than angle 82 in FIG. 7B.

It will be understood from FIGS. 7A-7C that system 13 uses a spherically symmetric beam 52 that allows simplicity in the design of the optical assembly and yet provides system 13 with a capability to eject droplets 70 at an angle that is not normal to surface 69 by having hole 68 in film 62. Typically, the user of system 13 may direct beam 52 to impinge on film 62 at a selected distance from hole 68, so as to set a desired ejection angle of droplets 70, from donor 11 to substrate 24. In the examples described in FIGS. 7A-7C, the shorter the distance between hole 68 and location 73, the larger is the ejected angle from film 62 with respect to surface 69.

Figure 8A:
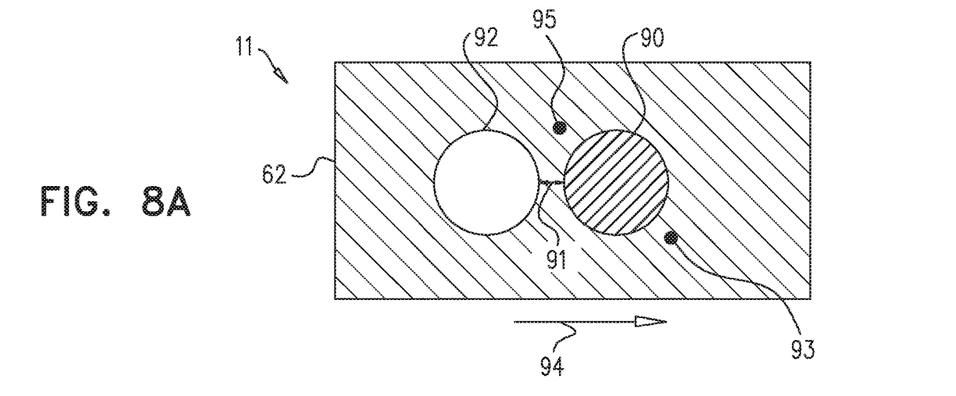
FIGS. 8A-8C are schematic pictorial illustrations of a donor and a heat barrier, in accordance with other embodiments of the present invention.
Figure 8B:
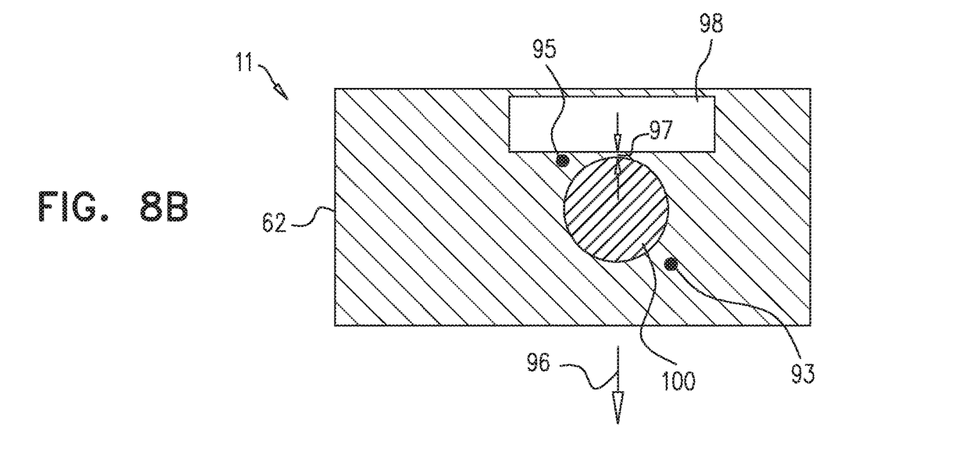
Figure 8C:
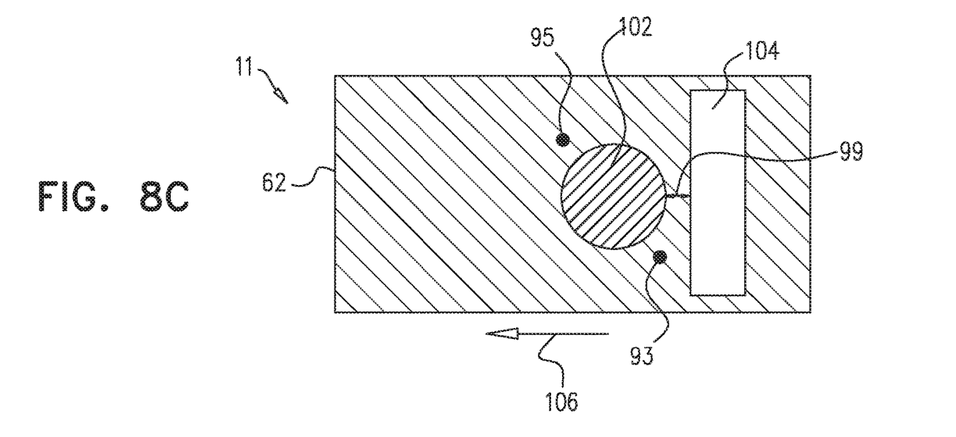

FIGS. 8A-8C are schematic pictorial illustrations of donor 11 and different heat barriers, as seen from circuit 12 located below donor 11, in accordance with an embodiment of the present invention. Except as indicated below, donor 11 comprises film 62, which covers the area of surface 69.

FIG. 8A illustrates a round hole in film 62 that provides a heat barrier 92. Optical assembly 21 (not shown in FIG. 8A) directs symmetric beam 52 to impinge on film 62 at a round spot 90, located on the left side of barrier 92, and in close proximity to the barrier. (Typically, barrier 92 and spot 90 in FIG. 8A correspond in general to hole 68 and location 73 in FIG. 7B.) In FIG. 8A an arrow 94 indicates the direction of ejected droplet 70, and illustrates the ejection direction of droplet 70 at angle 82 in FIG. 7B. When beam 52 impinges on film 62, the heat dissipates around spot 90. The temperature gradient in space 91 is, however, steeper compared to the temperature gradients at other points around spot 90. Points 93 and 95 are located at a similar distance from the edge of spot 90, but because of barrier 92 the temperatures at points 93 and 95 are different from one another, and are different from the temperature at space 91. The different temperatures illustrate the asymmetric thermal profile around spot 90 and results in the ejection of droplet 70 to the right.

FIG. 8B illustrates a rectangular hole in film 62, which represents a heat barrier 98. Optical assembly 21 (not shown in FIG. 8B) directs symmetric beam 52 to impinge on film 62 at a round spot 100, located below barrier 98.

When beam 52 impinges on film 62, the resultant heat dissipates around spot 100, creating a non-uniform temperature gradient around spot 100 due to the proximity to barrier 98. The gradient between spot 100 and barrier 98 is steep. Due to the rectangular shape of barrier 98, point 95 is very close to the heat barrier, and thus, even though both points 93 and 95 are located at a similar distance from the edge of spot 90, their temperatures are different. As for the situation of FIG. 8A the different temperatures illustrate the asymmetric thermal profile around spot 90. An arrow 96 indicates the direction of ejected droplet 70, and in the example of FIG. 8B, arrow 96 points down since barrier 98 is located above spot 100.

FIG. 8C illustrates a rectangular hole in film 62, which represents a heat barrier 104. Optical assembly 21 (not shown in FIG. 8C) directs symmetric beam 52 to impinge on film 62 at a round spot 102, located on the left side of barrier 104.

When beam 52 impinges on film 62, the resultant heat dissipates around spot 102, creating a non-uniform temperature gradient around spot 102 due to the proximity to barrier 104. As for the situation of FIG. 8B both points 93 and 95 are located at a similar distance from the edge of spot 90, but because of the presence of barrier 104 their temperatures are different. The different temperatures illustrate the asymmetric thermal profile around spot 102. An arrow 106 indicates the direction of ejected droplet 70, and in the example of FIG. 8C, arrow 106 points to the left since barrier 104 is located on the right side of spot 100.

From the above description of FIGS. 7A-8C, it will be understood that the shape and dimension of the heat barrier in film 62, together with the barrier's distance from the impingement point of the laser beam on the film, all contribute to the asymmetric thermal profile generated in the film. It will be appreciated that by selection of these barrier parameters, i.e., the barrier shape, dimensions and distance, both the direction and the value of the ejection angle of any given droplet 70 in system 13 may be set to substantially any desired value by a user of the system.

The systems described above have used a single beam 52. However, those having ordinary skill in the art will be able to adapt the description for the case of parallel printing, where multiple input beams are used in concurrently. U.S. patent application 62/078,450 to Kotler, et al., whose disclosure is incorporated herein by reference, and describes a method for producing multiple beams that may be used for parallel printing.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art.

The invention claimed is:

1. An apparatus for material deposition on an acceptor surface, the apparatus comprising:
   a transparent donor substrate having a first surface and a second surface that is opposing the first surface, and comprising a donor film on the second surface; and
   an optical assembly, comprising:
      a laser, which is configured to emit a beam of radiation; and
      a beam manipulator, which is configured to direct the beam of radiation to pass through the first surface of the donor substrate and impinge on the donor film at a location on the second surface so as to induce ejection of droplets of molten material from the donor film at an angle that is not normal to the second surface at the location onto the acceptor surface.

2. The apparatus according to claim 1, wherein the beam manipulator is configured to generate an asymmetry in the beam that is selected so as to cause the droplets to be ejected at a selected angle that is not normal to the second surface.

3. The apparatus according to claim 2, wherein the beam manipulator comprises an acousto-optic deflector (AOD) configured to form the beam of radiation as a plurality of sub-beams exiting from the AOD at respective different angles, the sub-beams together forming a composite beam having the asymmetry.

4. The apparatus according to claim 3, wherein the beam manipulator is configured to input a drive signal having multiple frequencies to the AOD so as to form the sub-beams by diffraction in the AOD.

5. The apparatus according to claim 4, and comprising a processor which is configured to synchronize between the beam of radiation and the multiple frequencies of the drive signal so as to form the composite beam having the asymmetry.

6. The apparatus according to claim 2, wherein the beam manipulator comprises a plurality of mirrors configured to form the beam of radiation as a plurality of sub-beams which together form a composite beam having the asymmetry.

7. The apparatus according to claim 6, wherein the beam manipulator is configured to introduce the asymmetry into the composite beam by controlling at least one of a rotation and an elevation of one or more of the mirrors.

8. The apparatus according to claim 6, wherein the beam manipulator is configured to introduce the asymmetry into the composite beam by adjusting an elevation of one or more of the mirrors, thereby controlling respective phases of one or more selected sub-beams using the mirrors.

9. The apparatus according to claim 2, wherein the beam manipulator comprises a liquid crystal cell array configured to form the beam of radiation as a plurality of sub-beams which together form a composite beam having the asymmetry.

10. The apparatus according to claim 9, wherein the beam manipulator is configured to introduce the asymmetry into the composite beam by controlling respective phases of one or more selected sub-beams using cells of the liquid crystal cell array.

11. The apparatus according to claim 1, wherein the donor film has a non-uniformity at a position on the second surface, and wherein the beam manipulator is configured to direct the beam to impinge on the donor film in proximity to the position in order to cause the droplets to be ejected at a selected angle that is not normal to the second surface.

12. The apparatus according to claim 11, wherein the beam impinging on the donor film is spherically symmetric.

13. The apparatus according to claim 11, wherein the non-uniformity comprises at least one of a hole and a trench in the donor film.

14. The apparatus according to claim 11, wherein the non-uniformity has a predefined shape chosen to cause the droplets to be ejected at the selected angle.

15. The apparatus according to claim 11, wherein a distance of a point of impingement of the beam from the position is chosen to cause the droplets to be ejected at the selected angle.

16. The apparatus according to claim 11, wherein the optical assembly is configured to form the non-uniformity in the donor film using the beam of radiation.

17. The apparatus according to claim 16, wherein the non-uniformity comprises first and second non-uniformities, and wherein the beam manipulator is configured to form the second non-uniformity after a formation of the first non-uniformity, and before or after the ejection of the droplets.

18. A method for material deposition on an acceptor surface, the method comprising:
   providing a transparent donor substrate having a first surface and a second surface that is opposing the first surface, and a donor film on the second surface; and
   directing a beam of radiation to pass through the first surface of the donor substrate and impinge on the donor film at a location on the second surface so as to induce ejection of droplets of molten material from the donor film at an angle that is not normal to the second surface at the location onto the acceptor surface.

19. The method according to claim 18, and comprising generating an asymmetry in the beam that is selected so as to cause the droplets to be ejected at a selected angle that is not normal to the second surface.

20. The method according to claim 19, and comprising configuring an acousto-optic deflector (AOD) to form the beam of radiation as a plurality of sub-beams, exiting from the AOD at respective different angles, the sub-beams together forming a composite beam having the asymmetry.

21. The method according to claim 20, and comprising inputting multiple frequencies of a drive signal to the AOD so as to form the sub-beams by diffraction in the AOD.

22. The method according to claim 21, wherein the beam of radiation is generated using a sequence of laser pulses, and comprising synchronizing between the laser pulses and the multiple frequencies of the drive signal so as to form the composite beam having the asymmetry.

23. The method according to claim 19, and comprising configuring a plurality of mirrors to form the beam of radiation as a plurality of sub-beams which together form a composite beam having the asymmetry.

24. The method according to claim 23, wherein configuring the mirrors comprises introducing the asymmetry into the composite beam by controlling at least one of a rotation and an elevation of one or more of the mirrors.

25. The method according to claim 23, wherein configuring the mirrors comprises introducing the asymmetry into the composite beam by adjusting the elevation of one or more of the mirrors, thereby controlling respective phases of one or more selected sub-beams using the mirrors.

26. The method according to claim 19, and comprising configuring a liquid crystal cell array to form the beam of radiation as a plurality of sub-beams which together form a composite beam having the asymmetry.

27. The method according to claim 26, wherein configuring the liquid crystal cell array comprises introducing the asymmetry into the composite beam by controlling respective phases of one or more selected sub-beams using cells of the liquid crystal cell array.

28. The method according to claim 18, wherein the donor film has a non-uniformity at a position on the second surface, the method further comprising directing the beam to impinge on the donor film in proximity to the position in order to cause the droplets to be ejected at a selected angle that is not normal to the second surface.

29. The method according to claim 28, wherein the beam impinging on the donor film is spherically symmetric.

30. The method according to claim 28, wherein the non-uniformity comprises at least one of a hole and a trench in the donor film.

31. The method according to claim 28, and comprising choosing the non-uniformity to have a predefined shape so as to cause the droplets to be ejected at the selected angle.

32. The method according to claim 28, and comprising choosing a distance of a point of impingement of the beam from the position so as to cause the droplets to be ejected at the selected angle.

33. The method according to claim 28, and comprising forming the non-uniformity in the donor film using the beam of radiation.

34. The method according to claim 33, wherein forming the non-uniformity comprises forming the non-uniformity after beginning ejection of the droplets.

\* \* \* \* \*